(12) United States Patent
Cappelletti et al.

(10) Patent No.: US 6,275,960 B1
(45) Date of Patent: Aug. 14, 2001

(54) SELF-TEST AND CORRECTION OF LOSS OF CHARGE ERRORS IN A FLASH MEMORY, ERASABLE AND PROGRAMMABLE BY SECTORS THEREOF

(75) Inventors: Paolo Cappelletti, Seveso; Alfonso Maurelli, Sulbiate; Marco Olivo, Bergamo, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/212,896

(22) Filed: Dec. 16, 1998

(30) Foreign Application Priority Data

Dec. 22, 1997 (EP) .................................................. 97830693

(51) Int. Cl.[7] ........................... G11C 29/00; H03M 13/03
(52) U.S. Cl. ........................... 714/718; 714/763; 714/766; 714/800
(58) Field of Search ..................................... 714/763, 764, 714/766, 773, 800, 718, 742, 52, 42, 6, 5, 710, 711, 805, 804, 802; 365/200, 201; 324/512, 522, 523

(56) References Cited

U.S. PATENT DOCUMENTS

| | | | | |
|---|---|---|---|---|
| 4,768,193 | * | 8/1988 | Takemae | 714/711 |
| 4,939,694 | * | 7/1990 | Eaton et al. | 365/200 |
| 5,151,906 | * | 9/1992 | Sawada | 714/805 |
| 5,475,693 | | 12/1995 | Christopherson et al. | 371/10.2 |
| 5,581,567 | * | 12/1996 | Chen et al. | 714/758 |
| 5,671,239 | | 9/1997 | Higashitani et al. | 371/51.1 |

* cited by examiner

*Primary Examiner*—Christine T. Tu
(74) *Attorney, Agent, or Firm*—Theodore E. Galanthay; Allen, Dyer, Doppelt, Milbrath & Gilchrist, P.A.

(57) ABSTRACT

A method is for self-test and correction of errors due to a loss charge for a flash memory including an array or matrix of cells (bits), organized in rows and columns, erasable and programmable by whole sectors in which the matrix is divided. The method is implemented by realizing at least one additional row and at least one additional column of cells for each memory sector, storing parity codes in the additional row and column, and carrying out periodically a self-test routine and eventual correction routine including the following steps: repeating the sequential reading per bytes and parity check; verifying the consistency of the parity value with the value stored in the respective parity bit; and if the verification is negative, retaining the current row address and proceeding to sequentially verify column parity starting from the first column until identifying the column for which the verification yields a negative result, and if the failed bit so identified is "1" reprogramming it to "0".

27 Claims, 1 Drawing Sheet

SELF-TEST AND CORRECTION OF LOSS OF CHARGE ERRORS IN A FLASH MEMORY, ERASABLE AND PROGRAMMABLE BY SECTORS THEREOF

FIELD OF APPLICATION

The present invention relates to memories, and, more particularly, to flash EPROM memories or more simply to flash memories erasable and reprogrammable by sectors.

BACKGROUND OF THE INVENTION

There is a continuing evolution towards flash memory devices with higher and higher memory capacities, reached by reducing the size of memory cells. As known to those skilled in the art, the limitations in scaling down integrated devices, besides being due to technological limitations of the fabrication processes, may also be determined by criticalities that negatively affect reliability of the produced devices and therefore reduce the yield of the fabrication process.

Usually, fabricated devices are tested in relation to known critical mechanisms which are accentuated by the scaling down process. This is done by subjecting the devices to specially designed testing cycles. During these testing cycles one of the factors for enhancing critical aspects is the temperature. Increased temperature generally tends to worsen or accelerate the failure mechanisms of those devices that contain elements or cells operating at the limit of their reliability.

It has been recently discovered a new failure mechanism of flash memories which apparently is induced exclusively by cyclings, that is, by the number of erasing and programming cycles to which the memory device is subjected. The new failure manifests itself as a loss of charge of single cells during prolonged tests of data retention of data programmed at a low temperature (for example, at ambient temperature).

Although the probability of this phenomenon, in terms of number of lost bits is very low (ranging from $10^{-8}$ to $10^{-9}$), its occurrence implies the failure of memories commonly having a capacity of many megabytes. This results in missing the specified failure targets required by many applications for these devices.

On the other hand, this type of failure hardly lends itself to a preventive screening at the level of the testing process because the failure mechanism is induced by the number of cycles and the loss of charge may not otherwise be accelerated. This problem has been recently approached at a system level by introducing a dedicated refresh operation of the contents of the programmed memory. However, this does not eliminate the problem, because it requires that the system be permanently powered. A peculiar characteristic of nonvolatile memories should be their capacity of retaining the programmed information, even in absence of power supply.

SUMMARY OF THE INVENTION

In view of the foregoing background an approach has now been found that uses a process of self-test and correction of loss of charge errors that may be performed at every power-on and/or pursuant to a command. The effectiveness rests on the fact that the number of bits that may cause this kind of failure through a loss of charge is relatively low and sufficiently so to statistically exclude the occurrence of two or more failures in a same sector of a multi-sector flash memory matrix.

DETAILED DESCRIPTION OF THE PREFERRED EMBODIMENTS

Figure 1:
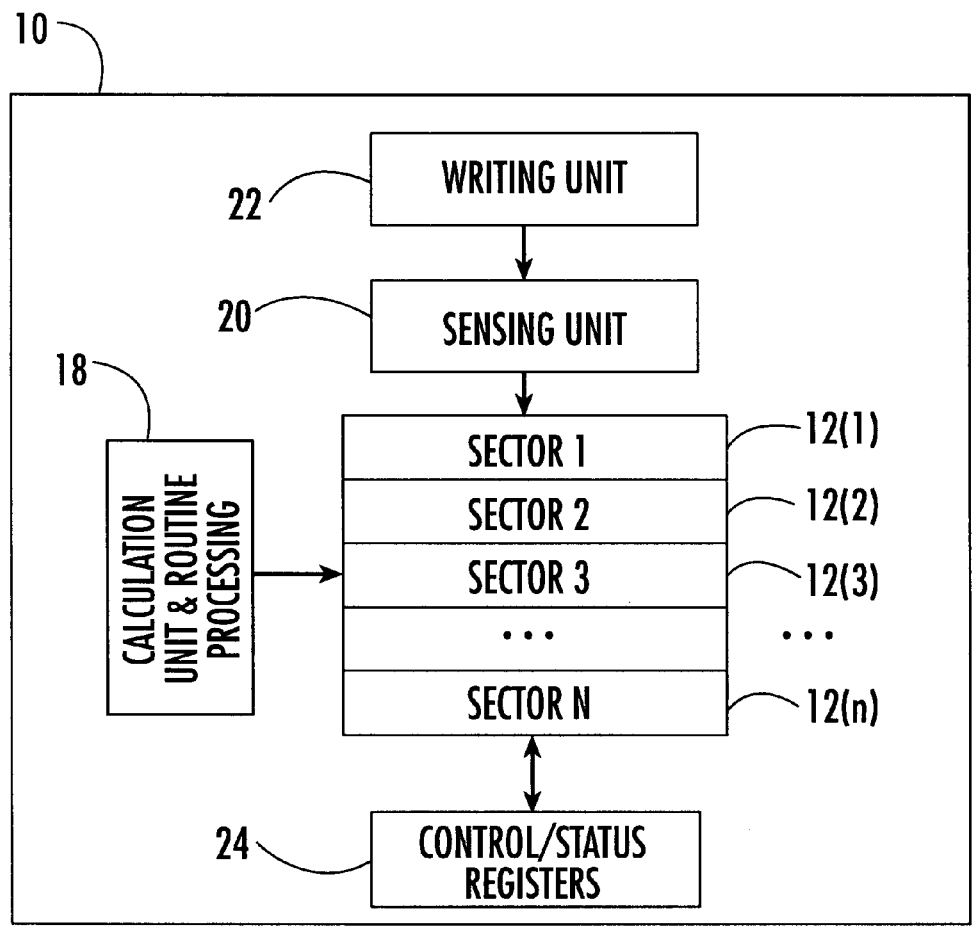
FIG. 1 illustrates a top level block diagram of a flash memory in accordance with the present invention.

According to the invention, each sector, into which the flash memory matrix, erasable and programmable by whole sectors, is commonly divided, is furnished with an additional row and column in which to store parity bits. Thus, according to the method of this invention, each programming or writing operation of any sector terminates with a double re-reading of the sector itself for the calculation of the parity bits and their storage in the provided additional row and column.

To make the above concept more explicit, the programming algorithm of a memory sector may, for example, imply the following procedure at the end of the normal programming process of the sector:

starting from row "0", all the bytes of the row are read in sequence, the parity is verified by counting the number of "1"s and the relative parity bit is programmed when the number of "1"s of the row is even;

the row address is incremented and the preceding operation is repeated, and so forth until exhausting all the rows of the sector;

upon repositioning on the first byte of the zero row, all the bytes of the zero column are read, by counting the number of "1"s of each column and, similarly to what occurred above in relation to the rows we verify the parity, and thereafter the column parity bits are programmed; and the column address is incremented and the preceding operation is repeated and so forth until exhausting the columns of the sector.

For a sector of 64 Kbytes, the entire operation may require not more than 200 ms. The self-test operation and correction of loss of charge errors that are detected, includes verifying the correctness of the parity codes of a sector and eventually in proceeding with the correction of an error. The correction is achieved by reprogramming the bit that has lost its charge.

Also in this case, to make the above concept more explicit, a self-test and correction algorithm may, for example, be the following:

starting from row "0" all the bytes of the row are read in sequence, computing the parity and verifying its consistency with the value stored in the row parity bit;

if the verification is positive, the row address is incremented and the operation is repeated until exhausting all the rows of the sector;

if the verification is negative, a pointer is set on the row number and the procedure that verifies the columns parity is started; and upon identifying the column in which the parity verification is negative, it is checked whether the bit pointed on the row is a "1" and if this is true the bit is programmed.

Should the bit so identified be a "0" it would mean that the failure is due to a rather unlikely different mechanism (charge acquisition) and as such it would not be correctable. However, in this case, the routine may activate a noncorrectable error alert message.

Preferably, the self-test and error correction algorithm should resume the parity verification and carry it on until exhausting all the remaining rows of the sector, thus verifying for the existence of a second error in the same sector. If a second error existed in the same sector the correction operation would not be successfully completed.

The method of the invention is not intrinsically limited to make up for the presence of a single error per sector. Indeed, this apparent limitation may be reduced by adding more columns and rows for each sector in which to store as many parity codes. For example, by inserting 8 columns for each parity bits rather than one, the limit would change from an error per sector to an error per ⅛th of a sector.

Preferably, the reading of data during the self-tests that verify the parity codes is carried out with an adequate margin, for example, by adopting the same reading conditions used during a so-called "program-verify" procedure. A self-test command may be automatically inserted in the system switch-on routine or may be launched by the system periodically in performing memory refresh operations.

Differently from what occurs during the execution of a common program verify routine, in which the correction of detected programming error takes place simultaneously with the reading phase, the selftest and error correction procedure of the invention does not take place during a reading phase of the flash memory. Instead the self-test and error correction procedure of the invention is a stand alone operation of verifying and reestablishing an eventually lost bit.

The correction of a lost bit does not imply the implementation of a complex algorithm, which on the contrary is relatively simple because the control is effected row by row and thereafter column by column, or in an inverted order. Even with respect to refresh procedures, as commonly done in the case of DRAM memories, where it is essential that the eventually altered bit is not totally lost but maintains a residue of information, in a refresh operation implementing the self-test and eventual error correction of the invention, the bit may have been completely lost.

The self-test and error correction method of the invention is applicable to NOR flash memories (that is, in memories that do not adopt a double Fowler-Nordheim mechanism) and is effective, as already explained above, only in the case of errors due to a loss of charge: "0"→"1". The invention is particularly effective in applications such as the so-called SMART CARD, by providing for a refresh method of unpowered mass memory media.

Figure 2:
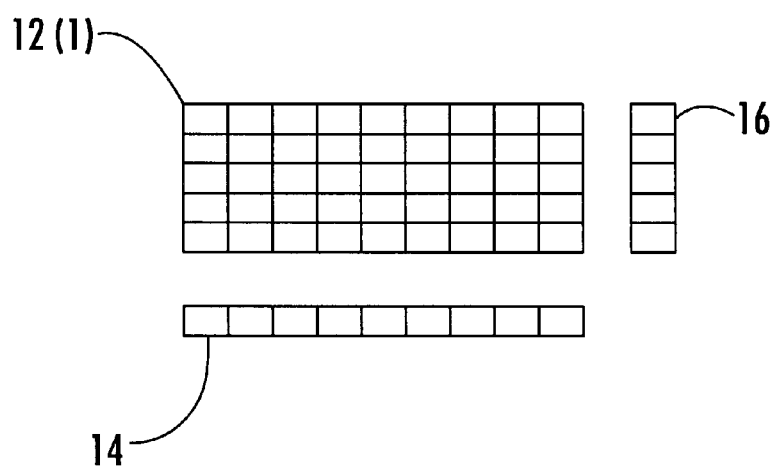
FIG. 2 illustrates at least one additional row and column for one of the memory array sectors illustrated in FIG. 1.

Referring now to FIGS. 1 and 2, another aspect of the invention is directed to a system, such as a SMART CARD, for example, comprising a flash memory 10 being erasable and programmable by whole sectors 12(1)–12(n). The flash memory 10 comprises an array 12 of NOR cells organized in rows and columns. Each sector, such as sector 12(1), for example, comprises at least one additional column 14 and at least one additional row 16 in which to store parity codes relative to parity checks of bytes of each row and parity checks of bytes of each column, respectively, and allowing for periodic selftesting checks and correction of eventual loss of charge error of at least one cell per sector.

The system is responsive to a set of instructions for performing the self-test and correction comprising the steps of storing parity codes in the at least one additional row 16 and in the at least one additional column 14, respectively. This is done by reading in sequence all bytes of a first row of a sector, counting the number of "1"s in the first row, verifying a parity, and programming a respective parity bit in the at least one additional column 14. The reading, counting, verifying and programming operations are repeated by incrementing a row address until executing the operations for a last row of the sector.

With respect to the columns of a sector, the steps further include reading in sequence all bytes of a first column of the sector, counting the number of "1"s in the first column, verifying a parity, and programming a respective parity bit in the at least one additional row 16. The reading, counting, verifying and programming operations are repeated by incrementing a column address until executing the operations for a last column of the sector.

The carrying out periodically of a self-test routine and eventual correction routine comprises repeating the reading in sequence per bytes and parity check, and verifying parity consistency of the parity check value with the respective stored parity bit.

If the verifying parity consistency is negative, a current row address is retained and the flash memory proceeds to sequentially verifying column parity starting from the first column until identifying a column for which verification yields a negative result thereby identifying a failed bit. If the failed bit is a "1", then it is reprogrammed to a "0". The set of instructions may be stored within a calculation and routine processing unit 18. The system further includes a sensing unit 20, a writing unit 22, and control and status registers 24 as readily understood by one skilled in the art.

That which is claimed is:

1. A method of self-test and correction of errors due to a loss charge for a flash memory comprising an array of cells organized in rows and columns, and being erasable and programmable by whole sectors in which the array is divided, the method comprising the steps of:

realizing at least one additional row and at least one additional column of cells for each memory sector;

storing parity codes in the additional at least one row and in the additional at least one column, respectively, by reading in sequence all bytes of a first row of a sector, counting the number of "1"s in the first row, verifying a parity, and programming a respective parity bit in the additional at least one column, and repeating the reading, counting, verifying and programming operations by incrementing a row address until executing the operations for a last row of the sector, and reading in sequence all bytes of a first column of the sector, counting the number of "1"s in the first column, verifying a parity, and programming a respective parity bit in the additional at least one row and repeating the reading, counting, verifying and programming operations by incrementing a column address until executing the operations for a last column of the sector; and carrying out periodically a self-test routine and eventual correction routine comprising the following steps repeating the reading in sequence per bytes and parity check, verifying parity consistency of the parity check value with the respective stored parity bit, if the verifying parity consistency is negative, retaining a current row address and proceeding to sequentially verify column parity starting from the first column until identifying a column for which verification yields a negative result thereby identifying a failed bit, and if the failed bit is "1" reprogramming it to "0".

2. A method according to claim 1, further comprising the step of triggering a noncorrectable error alert if the failed bit is "0".

3. A method according to claim 1, further comprising the step of furnishing each sector with more than one additional column and more than one additional row in which to store as many parity codes thereby allowing for correcting more than one failed bit per sector.

4. A method according to claim 1, wherein the steps of reading in performing parity checks are done under program-verify conditions.

5. A method according to claim 1, further comprising carrying out the method automatically during a power-on routine of a system employing the flash memory.

6. A method according to claim 1, further comprising carrying out the method in response to a command.

7. A method according to claim 1, wherein the cells of the flash memory are NOR cells.

8. A method of self-test and correction of errors due to a loss charge for a flash memory comprising an array of cells organized in rows and columns, and being erasable and programmable by whole sectors in which the array is divided, the flash memory comprising at least one additional row and at least one additional column of cells for each memory sector, the method comprising the steps of:

storing parity codes in the additional at least one row and in the additional at least one column, respectively, by reading in sequence all bytes of a first row of a sector, counting the number of "1"s in the first row, verifying a parity, and programming a respective parity bit in the additional at least one column, and repeating the reading, counting, verifying and programming operations by incrementing a row address until executing the operations for a last row of the sector, and reading in sequence all bytes of a first column of the sector, counting the number of "1"s in the first column, verifying a parity, and programming a respective parity bit in the additional at least one row and repeating the reading, counting, verifying and programming operations by incrementing a column address until executing the operations for a last column of the sector; and carrying out periodically a self-test routine and eventual correction routine comprising the following steps repeating the reading in sequence per bytes and parity check, verifying parity consistency of the parity check value with the respective stored parity bit, if the verifying parity consistency is negative, retaining a current row address and proceeding to sequentially verify column parity starting from the first column until identifying a column for which verification yields a negative result thereby identifying a failed bit, and if the failed bit is "1" reprogramming it to "0".

9. A method according to claim 8, further comprising the step of triggering a noncorrectable error alert if the failed bit is "0".

10. A method according to claim 8, further comprising the step of furnishing each sector with more than one additional column and more than one additional row in which to store as many parity codes thereby allowing for correcting more than one failed bit per sector.

11. A method according to claim 8, wherein the steps of reading in performing parity checks are done under program-verify conditions.

12. A method according to claim 8, further comprising carrying out the method automatically during a power-on routine of a system employing the flash memory.

13. A method according to claim 8, further comprising carrying out the method in response to a command.

14. A method according to claim 8, wherein the cells of the flash memory are NOR cells.

15. A method operating a flash memory comprising an array of cells organized in rows and columns, and being erasable and programmable by whole sectors in which the array is divided, the flash memory comprising at least one additional row and at least one additional column of cells for each memory sector, the method comprising the steps of:

performing a self-test and correction of errors due to a loss charge for the flash memory automatically during a power-on routine of a system employing the flash memory, the self-test and correction comprising the steps of storing parity codes in the additional at least one row and in the additional at least one column, respectively, by reading in sequence all bytes of a first row of a sector, counting the number of "1"s in the first row, verifying a parity, and programming a respective parity bit in the additional at least one column, and repeating the reading, counting, verifying and programming operations by incrementing a row address until executing the operations for a last row of the sector, and reading in sequence all bytes of a first column of the sector, counting the number of "1"s in the first column, verifying a parity, and programming a respective parity bit in the additional at least one row and repeating the reading, counting, verifying and programming operations by incrementing a column address until executing the operations for a last column of the sector; and carrying out periodically a self-test routine and eventual correction routine comprising the following steps repeating the reading in sequence per bytes and parity check, verifying parity consistency of the parity check value with the respective stored parity bit, if the verifying parity consistency is negative, retaining a current row address and proceeding to sequentially verify column parity starting from the first column until identifying a column for which verification yields a negative result thereby identifying a failed bit, and if the failed bit is "1" reprogramming it to "0".

16. A method according to claim 15, further comprising the step of triggering a noncorrectable error alert if the failed bit is "0".

17. A method according to claim 15, further comprising the step of furnishing each sector with more than one additional column and more than one additional row in which to store as many parity codes thereby allowing for correcting more than one failed bit per sector.

18. A method according to claim 15, wherein the cells of the flash memory are NOR cells.

19. A method operating a flash memory comprising an array of cells organized in rows and columns, and being erasable and programmable by whole sectors in which the array is divided, the flash memory comprising at least one additional row and at least one additional column of cells for each memory sector, the method comprising the steps of:

performing a self-test and correction of errors due to a loss charge for the flash memory responsive to a command, the self-test and correction comprising the steps of storing parity codes in the additional at least one row and in the additional at least one column, respectively, by reading in sequence all bytes of a first row of a sector, counting the number of "1"s in the first row, verifying a parity, and programming a respective parity bit in the additional at least one column, and repeating the reading, counting, verifying and programming operations by incrementing a row address until executing the operations for a last row of the sector, and reading in sequence all bytes of a first column of the sector, counting the number of "1"s in the first column, verifying a parity, and programming a respective parity bit in the additional at least one row and repeating the reading, counting, verifying and programming operations by incrementing a column address until executing the operations for a last column of the sector; and carrying out periodically a self-test routine and eventual correction routine comprising the following steps repeating the reading in sequence per bytes and parity check, verifying parity consistency of the parity check value with the respective stored parity bit, if the verifying parity consistency is negative, retaining a current row address and proceeding to sequentially verify column parity starting from the first column until identifying a column for which verification yields a negative result thereby identifying a failed bit, and if the failed bit is "1" reprogramming it to "0".

20. A method according to claim 19, further comprising the step of triggering a noncorrectable error alert if the failed bit is "0".

21. A method according to claim 19, further comprising the step of furnishing each sector with more than one additional column and more than one additional row in which to store as many parity codes thereby allowing for correcting more than one failed bit per sector.

22. A method according to claim 19, wherein the cells of the flash memory are NOR cells.

23. A system comprising:

a flash memory being erasable and programmable by whole sectors, said flash memory comprising an array of NOR cells organized in rows and columns;

each sector comprising at least one additional column and at least one additional row in which to store parity codes relative to parity checks of bytes of each row and parity checks of bytes of each column, respectively, allowing for periodic self-testing checks and correction of eventual loss of charge error of at least one cell per sector; and said flash memory being responsive to a set of instructions for performing the self-test and correction by storing parity codes in the at least one additional row and in the at least one additional column, respectively, by reading in sequence all bytes of a first row of a sector, counting the number of "1"s in the first row, verifying a parity, and programming a respective parity bit in the at least one additional column, and repeating the reading, counting, verifying and programming operations by incrementing a row address until executing the operations for a last row of the sector, and reading in sequence all bytes of a first column of the sector, counting the number of "1"s in the first column, verifying a parity, and programming a respective parity bit in the at least one additional row and repeating the reading, counting, verifying and programming operations by incrementing a column address until executing the operations for a last column of the sector, and carrying out periodically a self-test routine and eventual correction routine comprising repeating the reading in sequence per bytes and parity check, verifying parity consistency of the parity check value with the respective stored parity bit, if the verifying parity consistency is negative, retaining a current row address and proceeding to sequentially verify column parity starting from the first column until identifying a column for which verification yields a negative result thereby identifying a failed bit, and if the failed bit is "1" reprogramming it to "0".

24. A system according to claim 23, wherein said flash memory triggers a noncorrectable error alert if the failed bit is "0".

25. A system according to claim 23, wherein said flash memory furnishes each sector with more than one additional column and more than one additional row in which to store as many parity codes thereby allowing for correcting more than one failed bit per sector.

26. A system according to claim 23, wherein the set of instructions are carried out automatically during a power-on routine of the system.

27. A system according to claim 23, wherein the set of instructions are carried out in response to a command.

* * * * *